United States Patent [19]
Connell

[11] Patent Number: 5,708,595
[45] Date of Patent: Jan. 13, 1998

[54] EFFICIENT MEDIAN FILTER AND METHOD THEREFOR

[75] Inventor: Lawrence Edwin Connell, Naperville, Ill.

[73] Assignee: Motorola Inc., Schaumburg, Ill.

[21] Appl. No.: 398,340

[22] Filed: Mar. 3, 1995

[51] Int. Cl.$^6$ .................................................. G06F 7/00
[52] U.S. Cl. .................................................. 364/715.01
[58] Field of Search ................ 364/715.01, 715.06, 364/724.01, 426.01, 431.01–.08; 73/112, 116; 340/146.2

[56] References Cited

U.S. PATENT DOCUMENTS

| | | | |
|---|---|---|---|
| 5,044,194 | 9/1991 | James et al. | 73/112 |
| 5,138,567 | 8/1992 | Mehrgardt | 364/724.01 |
| 5,144,568 | 9/1992 | Glover | 364/715.01 |
| 5,426,785 | 6/1995 | Coffield | 395/800 |

OTHER PUBLICATIONS

IEEE Transactions on Acoustics, Speech, and Signal Processing, vol. ASSP–28, No. 4, Aug. 1980 (A Fast Method for Real–Time Median Filtering) by E. Ataman, Member, IEEE, V. K. Aatre, Senior Member, IEEE, and K. M. Wong.

IEEE Transactions on Acoustics, Speech, and Signal Processing, vol. ASSP-28, No. 4, Aug. 1980 (Windowless Techniques for LPC Analysis) by Thomas P. Barnwell, III.

IEEE Transactions on Acoustics, Speech, and Signal Processing, vol. ASSP-32, No. 6, Dec. 1984 (Median Filtering by Threshold Decomposition) by J. Patrick Fitch, Edward J. Coyle, and Neal C. Gallagher, Jr., Member, IEEE.

VLSI Implementation of a Fast Rank Order Filtering Algorithm by R. G. Harber, S. C. Bass, G. W. Neudeck, Mar. 26, 1985.

*Primary Examiner*—Chuong Dinh Ngo
*Attorney, Agent, or Firm*—Nicholas C. Hopman

[57] ABSTRACT

An efficient method and apparatus of median filtering includes a memory circuit (305) for holding a list of N data samples (109). A grading circuit (309, 321, 313, 311) identifies a first data sample of the N data samples that has a first metric with a magnitude less than or equal to (N–1)/2, and a second metric with a magnitude greater than or equal to (N–1)/2. The first metric is indicative of a quantity of data samples, exclusive of the first data sample, that have a magnitude less than a magnitude of the first data sample. The second metric is indicative of a quantity of data samples, exclusive of the first data sample, that have a magnitude less than or equal to the magnitude of the first data sample.

8 Claims, 2 Drawing Sheets

5,708,595

EFFICIENT MEDIAN FILTER AND METHOD THEREFOR

FIELD OF THE INVENTION

This invention is generally directed to the field of signal processing, and is particularly suited to constructing circuit storage memory efficient median filters.

BACKGROUND OF THE INVENTION

In contemporary digital signal processing schemes it is often desirable to apply a median filter to process a signal. Median filters are non-linear filters that can be used to achieve dramatic results in diverse subtractive synthesis applications such as in video, speech, general acoustics, radar, and other uses of signal processing.

In particular a median filter may be applied to significantly improve signal-to-noise ratio in internal combustion engine performance monitoring and control applications. One such application is misfire determination. In this application an engine's combustion performance is monitored by observing, for example, acceleration of the engine's crankshaft via an accelerometer. In an ideal situation, if a cylinder of the engine under observation misfires (all of the air-fuel mixture charged into the cylinder doesn't completely combust) the engine's crankshaft will tend to decelerate rather than accelerate as expected. If this deceleration is observed by a misfire detection system, then a misfire can be indicated.

In a typical application however there are may sources of noise that contaminate the observation process. For one, since the engine is mechanically coupled to a transmission, which in turn is coupled to a drive shaft and wheel assembly, as a vehicle powered by the engine traverses, a bump in the road surface can cause a decelerating disturbance to the wheel assembly. Through the above-described coupling mechanism the disturbance can be reversed coupled back to the engine's crankshaft—thus the accelerometer. Some form of signal fidelity improvement is necessary to eliminate this source of noise to prevent a false misfire indication. Since this source of noise causes a signal to be generated at a characteristically very low frequency the signal processing mechanism could use a traditional digital high-pass filter to filter out these disturbances. Practically this would require a very high order digital filter because the signal spectra generated by misfiring behavior by the accelerometer is closely proximate the signal spectra associated with the road surface induced signal.

A median filter fits well into this type of application for eliminating the road surface induced signal from the misfire related spectra generated by the accelerometer. The median filter achieves a similar result to a very high order digital high-pass filter with a relatively low order structure.

Digital or sampled data type median filters function by operating on a fixed-length list of data samples. The median filter determines which sample present on the fixed-length list represents a value arithmetically median within the list. Prior art median filters used a storage memory intensive scheme for resolving the median value within a list of data samples. For instance, once a list is filled with data it is sorted into an arithmetically ordered list and the data sample positioned in the center of the list becomes the median result. By subtracting the median result from the time ordered data sample positioned at the center of the time ordered list a median filtered data sample can be synthesized. This can be shown more clearly with an example.

TABLE 1

| time ordered data samples | magnitude ordered data samples |
|---|---|
| 135 | 130 |
| 130 | 131 |
| 137 | 135 |
| 138 | 137 |
| 131 | 138 |
| 140 | 140 |
| 143 | 143 |
| 148 | 143 |
| 143 | 148 |

In TABLE 1 above a left-most column represents a list of time ordered data samples. In other words the data sample in the top-most row "135" is the newest data sample and the data sample in the bottom-most row "143" is the oldest data sample. These samples are representative of acceleration of an engine's crankshaft derived from an accelerometer. A right-most column represents a list of magnitude ordered data samples. These samples are ordered by prior art schemes to find the median value. Since the list length (or filter order) is odd, the center position of the magnitude ordered list will contain the median data sample—here "138". So, the median filtered value can be derived as 131–138 or –7. Although this general approach is functional it has several problems. For one it requires at least enough storage memory to hold the magnitude ordered data sample list in addition to the time ordered data sample list. This is particularly problematic for reduction to practice on an integrated circuit because of the large area of silicon real estate necessary to support the additional storage memory requirements. Also, this scheme requires sorting each of the data samples on the list before the median data sample can be reliably found and is therefore time intensive and requires complicated control circuitry.

What is needed is an improved median filter that is storage memory and control circuitry efficient so that it can be effectively manufactured on an integrated circuit.

DETAILED DESCRIPTION OF A PREFERRED EMBODIMENT

In a preferred embodiment an efficient method and apparatus of median filtering includes a memory circuit for holding a list of N data samples. A grading circuit identifies a first data sample of the N data samples that has a first metric equal to $(N-1)/2$, where the first metric is indicative of a quantity of the remaining N data samples having a magnitude less than a magnitude of the first data sample. Since by definition the median data sample has an equal number of data samples with a magnitude below its magnitude and above its magnitude the first metric can alternatively be indicative of a quantity of the remaining N data samples having a magnitude greater than a magnitude of the first data sample. This approach works for a list of N data samples having distinct magnitudes—in other words no duplicate magnitudes.

If there are data samples having duplicate magnitudes in the list, then the grading circuit comprises a circuit for identifying a first data sample that has a first metric indicative of a quantity of data samples in the list, exclusive of the first data sample, having a magnitude less than a magnitude of the first data sample, and has a second metric indicative of a quantity of data samples, exclusive of the first data sample, that have a magnitude less than or equal to the first data sample. The grading circuit further comprises a circuit for identifying a median data sample as the first data sample of the data samples in the list that has a first metric with a magnitude less than or equal to $(N-1)/2$, and has a second metric with a magnitude greater than or equal to $(N-1)/2$.

Figure 1:
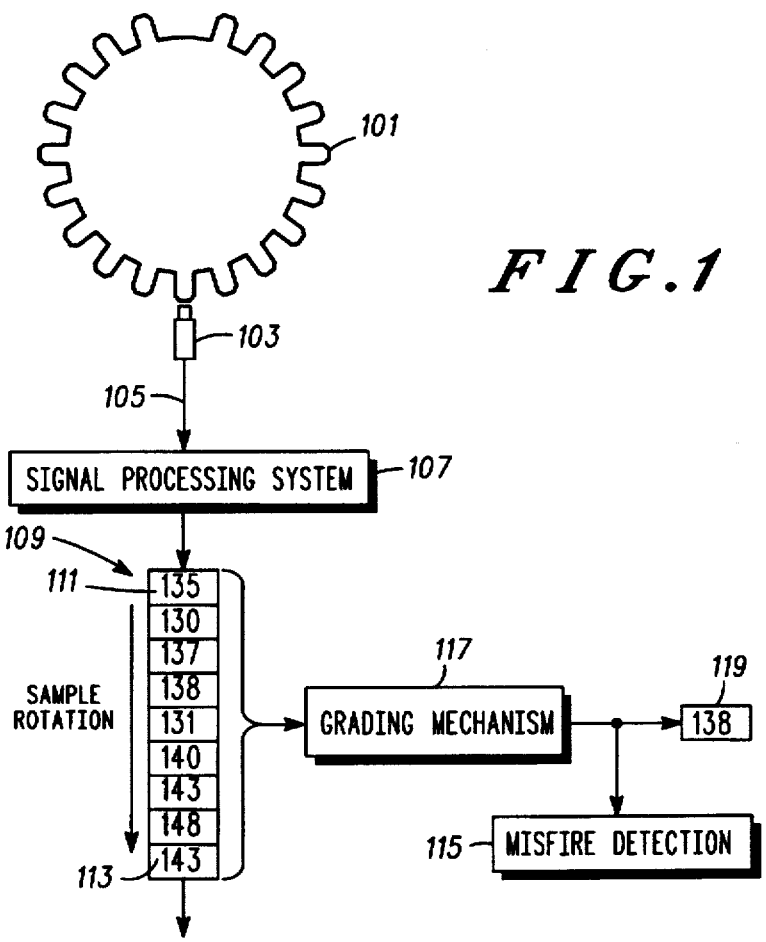
FIG. 1 is a system diagram in accordance with the invention.

The improved structure can be better appreciated by referring to the figures. FIG. 1 is a system diagram illustrating an overall approach for applying a median filter in a misfire detection system.

An engine crankshaft drives an encoder wheel 101 having marks disposed radially thereon. An accelerometer 103 senses the rotation of the encoder wheel 101, and outputs a signal 105 indicative of an acceleration of the encoder wheel 101. This signal 105 is coupled into a signal processing system 107. This signal processing system 107 digitizes the signal 105 and provides a discrete time sampled representation of the acceleration behavior of the encoder wheel 101. These discrete time data samples are provided to a storage memory device 109 preferably constructed as a circular queue. As the encoder wheel 101 rotates, each new data sample entry is stored into the storage memory device 109 by writing over the oldest data sample entry. For instance, in FIG. 1 reference number 111 shows the newest data sample which has a value of 135, and an oldest data sample 113 which has value of 143. As a next data sample becomes available, the oldest data sample 113 will be written over and replaced by the newest data sample. At a much higher rate than the data samples are changing, a grading mechanism 117 is used to find the median data sample within the list represented in the queue. This continuously graded median value 119, here the data sample having a value 138, is then used to produce a median filtered data sample. This filtering is accomplished by subtracting the continuously graded median value 119 from a time ordered median data sample from the queue. The result is presented to a misfire detection apparatus 115 which uses this continuously filtered median data sample to determine misfire behavior of the engine. Preferably, the misfire detection apparatus 115 includes a comparison circuit for providing a misfire indication when the median filtered data sample of the data samples in the queue exceeds a misfire threshold. The misfire threshold is preferably programmable and stored in the misfire detection apparatus 115.

Figure 2:
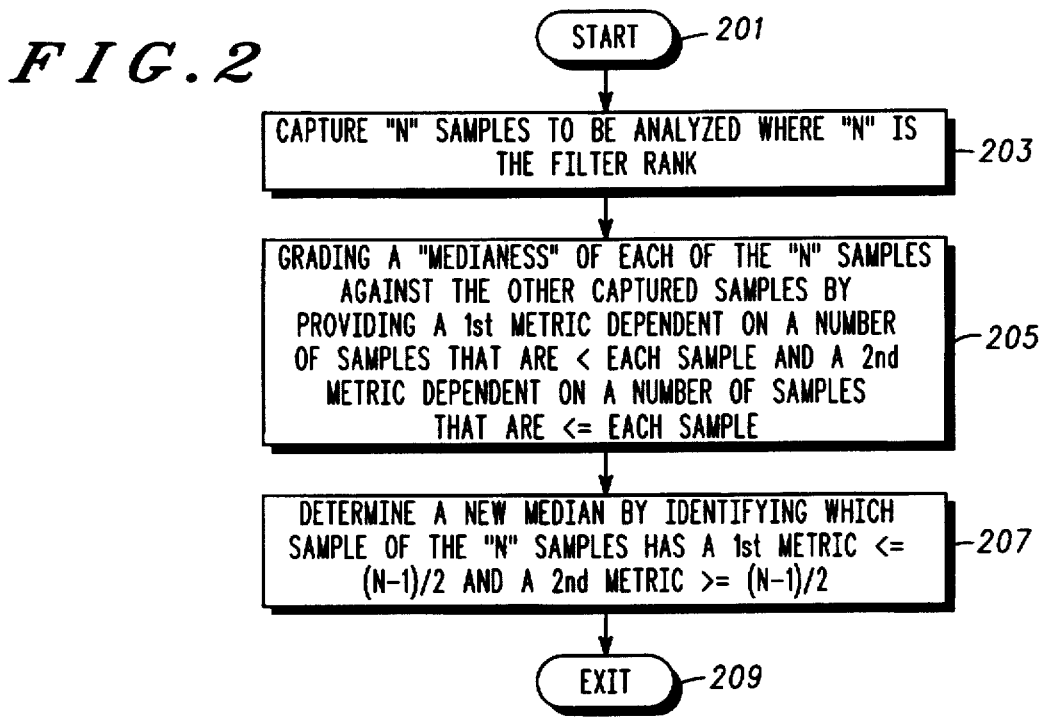
FIG. 2 is a flow chart illustrating various method steps in accordance with a method embodiment of the invention.

FIG. 2 is a flow chart illustrating various method steps in accordance with a method embodiment of the invention. In the method embodiment, the grading mechanism 117 shown in FIG. 1 is represented by a microcontroller such as a Motorola MC68332 microcontroller executing object code represented by the various method steps shown in the flow chart in FIG. 2. The grading method is started at step 201. Next at step 203, N samples are captured and the microcontroller's memory to be analyzed. Where N represents the rank or order of the median filter. Next in step 205, the microcontroller grades a "medianess" of each of the N samples against the other captured samples in the list by providing a first metric that is dependent on a number of samples that are less than each sample and a second metric that is dependent on a number of samples that are less than or equal to each data sample.

Then in step 207, a new median data sample of the captured data samples in the list is identified as the first sample of the N samples that satisfies the following equation.

EQUATION 1 new median="n"th sample having a 1st metric $\leq (N-1)/2$, and a 2nd metric $\geq (N-1)/2$ Then in step 209 the method step routine is exited. This routine shown in FIG. 2 is executed every time a new data sample is provided by the signal processing system 107 shown in FIG. 1.

Figure 3:
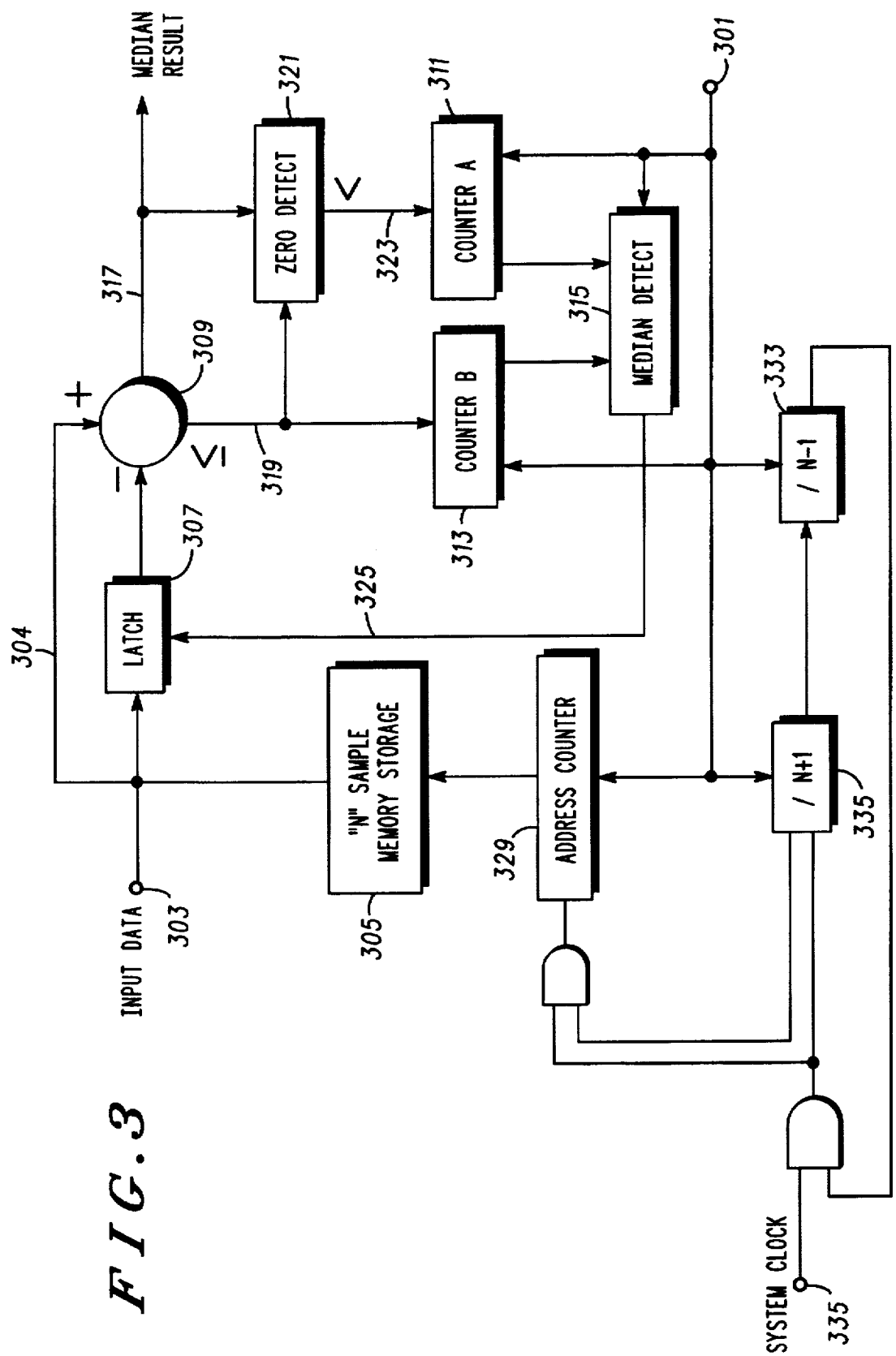
FIG. 3 is a schematic block diagram illustrating a preferred embodiment of the invention.

FIG. 3 is a schematic block diagram illustrating a preferred embodiment of the inventive median filter. The median filter is applicable to any list of N samples having an odd number of elements. Preferably, the list is time ordered as will be detailed below. Here a median data sample of an N data sample window is determined using a dedicated hardware implementation, easily reduced to a compact integrated circuit.. Once the median data sample is detected, it is then subtracted from a time centered data sample of the N time ordered data samples and a median filtered data sample is provided dependent thereon. The time centered data sample is the data sample positioned in the center of the time ordered list.

The window width N is called the rank, or order, of the filter. The rank is programmable by applying an input $NR_{MF}$ at input line 301. Here $NR_{MF}$ is set equal to $(N-1)/2$.

Operation begins by applying a new data sample at input terminal 303 which is then stored, via bi-directional bus, 304 into both an "N" sample memory storage circuit 305 and a latch 307. The "N" sample memory storage circuit 305 functions as a circular queue for storing a time ordered list of successively provided data samples by writing over the oldest data sample entry with the new data sample. The latch 307 is used to both store a sample under test as well as a detected median data sample when testing has completed.

A first sample to be tested is the new data sample which was stored in latch 307. The new data sample is tested by sequencing through a first pass of the "N" sample memory storage circuit 305 and comparing the contents of latch 307 with all other data samples stored in "N" sample memory storage circuit 305.

Samples are selected from the "N" sample memory storage circuit 305 under control of a simple module N address counter 329 which is programmable via $NR_{MF}$ input 301.

A divider 331 is a programmable N+1 divider and is used control when address counter 309 is incremented. Divider 331 determines that each sample is tested in N+1 system clock cycles as applied at system check input 335. Divider 333 is a programmable N-1 divider and is used to track each pass through the "N" sample memory storage circuit 305. Divider 333 is clocked once for every N+1 system clock cycles.

A subtracter circuit 309 is used to compare samples during testing as well as to provide the subtraction of the detected median data sample from the center of time ordered window when testing has completed. A first grading circuit comprised of counter A 311 and counter B 313 are used to record the results of each comparison and are initialized at the beginning of each pass through the list. The subtracter circuit 309 subtracts the contents of latch 307 from the current output of the "N" sample memory storage circuit 305 and provides an output result at line 317. Also provided is an output 319 indicative of when the current output of the "N" sample memory storage circuit 305 is less than or equal to the current contents of the latch 307. If the current output of the "N" sample memory storage circuit 305 is less than or equal to the contents of latch 307, counter B 313 is incremented. Otherwise, counter B 313 remains unchanged. Zero detect logic 321 is used to produce an output 323 indicative of when the current output of the "N" sample memory storage circuit 305 is less than the contents of latch 307. More specifically, zero detect logic 321 functions by monitoring the output result 317 of the subtracter circuit 309. If the output result at line 317 is zero, then the zero detect output 323 is forced inactive. Otherwise, the zero detect output 323 is normally driven to directly track the subtracter circuit output 319. If the current output of the "N" sample memory storage circuit 305 is less than the contents of latch 307, the counter A 311 is then incremented. Otherwise, counter A 311 remains unchanged. Once the current contents of latch 307 have been compared to all other samples stored in the "N" sample memory storage circuit 305, a second grading circuit—a median detect logic circuit 315, is enabled to examine the resultant contents of counter A 311 and counter B 313.

The median detect logic circuit 315 implements the deterministic relationship introduced above in EQUATION 1. If the contents of counter A are less than or equal to (N−1)/2, and the contents of counter B are greater than or equal to (N−1)/2, then the median detect logic circuit 315 will indicate the median data sample has been detected and will terminate further testing. When a first data sample satisfies the test of the median detect logic circuit 315, latch 307 is inhibited via line 325 from acquiring additional samples for test. This is an important feature of the described approach. Because the first data sample that satisfies the test of the median detect logic circuit 315 stops the median determination test this approach is time efficient when compared to prior art approaches.

If the current data sample under test is determined not to be the median data sample, a new sample from the "N" sample memory storage circuit 305 will be loaded into latch 307 and tested. Testing will continue until either the median data sample has been detected or N−1 samples have been tested. If the N−1 samples tested are found not to be the median data sample, then by definition the last remaining untested data sample is the median data sample and will subsequently be loaded into latch 307. Finally, the data sample which occurs at the center of the time ordered window is retrieved from the "N" sample memory storage circuit 305 and applied to the bi-directional bus 304. The detected median data sample, or median result, which was stored in latch 307 is then subtracted from the time centered data sample applied to the bi-directional bus 304, and a complete median filtered output sample is then produced at output 317 via the subtracter circuit 309.

Given the teaching of the preferred method and apparatus approaches one can derive other, equivalent, structures without departing from the essence of the described approach. For instance, the deterministic relationship shown in EQUATION 1, method step 205 and implemented in the median detect logic circuit 315 could be transposed or factored to the following relationship.

EQUATION 2 new median="n"th sample having a 1st metric<(N+1)/2, and a 2nd metric<(N+1)/2

To apply the relationship shown above in EQUATION 2 the second metric would have to be measured differently. For instance the second metric could be changed from a determination of a quantity of data samples that have a magnitude less than or equal to the sample under test to a quantity of data samples that have a magnitude greater than the sample under test.

In conclusion, an improved approach for constructing a median filter has been detailed. In an apparatus embodiment the described median filter is storage memory and control efficient so that it can be effectively manufactured on an integrated circuit. A significant amount circuit space is saved both because no additional storage memory is required and also because the control circuitry is comparatively simple when compared to other schemes.

What is claimed is:

1. An efficient median filter comprising:

a memory circuit for capturing N time ordered data samples; and a first grading circuit, operatively coupled to the memory circuit, for identifying a first metric and a second metric for each data sample of the N time ordered data samples, said first metric indicative of a quantity of data samples of the N time ordered data samples, exclusive of said data sample, that have a magnitude less than a magnitude of said data sample, and said second metric indicative of a quantity of data samples of the N time ordered data samples, exclusive of said data sample, that have a magnitude less than or equal to the magnitude of said data sample; and a second grading circuit for determining a data sample of the N time ordered data samples having a magnitude median within the N time ordered data samples by identifying which data sample of the N time ordered data samples has a first metric with a magnitude less than or equal to (N−1)/2, and a second metric with a magnitude greater than or equal to (N−1)/2.

2. An efficient median filter in accordance with claim 1 further comprising:

a subtraction circuit for subtracting the identified first data sample from a time centered data sample of the N time ordered data samples and providing a median filtered data sample dependent thereon.

3. An efficient median filter in accordance with claim 1 wherein N is a programmable quantity.

4. A engine combustion performance system comprising:

a data acquisition system for capturing data samples indicative of engine combustion performance in terms of acceleration;

a memory circuit for storing N time ordered data samples from the data samples captured by the data acquisition system;

a first grading circuit for determining a first metric and a second metric for each data sample of the N time ordered data samples, said first metric indicative of a quantity of data samples of the N time ordered data samples, exclusive of said each data sample, that have a magnitude less than a magnitude of said each data sample, and said second metric indicative of a quantity of data samples of the N time ordered data samples, exclusive of said each data sample, that have a magnitude less than or equal to the magnitude of said each data sample; and a second grading circuit for determining a data sample of the N time ordered data samples having a magnitude median within the N time ordered data samples by identifying which data sample of the N time ordered data samples has a first metric with a magnitude less than or equal to (N−1)/2, and a second metric with a magnitude greater than or equal to (N−1)/2.

5. A system in accordance with claim 4 further comprising:
   a subtraction circuit for subtracting the identified first data sample from a time centered data sample of the N time ordered data samples and providing a median filtered data sample dependent thereon.

6. A system in accordance with claim 5 further comprising a comparison circuit for providing a misfire indication when median filtered data sample exceeds a misfire threshold.

7. A system in accordance with claim 6 wherein N is a programmable quantity.

8. In an efficient median filter having a first and second grading circuit, a method of determining a median value of a continuous stream of data samples comprising the steps of:
   capturing N time ordered data samples into a memory circuit from the continuous stream of data;
   finding, for each, data sample of the N time ordered data samples, in the memory circuit, a first metric by said first grading circuit and a second metric by said second grading circuit, wherein the first metric is a measure of a quantity of data samples of the N time ordered data samples, exclusive of said each data sample, that have a magnitude less than a magnitude of said each data sample, and wherein the second metric is a measure of a quantity of data samples of the N time ordered data samples, exclusive of said each data sample, that have a magnitude less than or equal to the magnitude of said each data sample; and
   determining a data sample of the N time ordered data samples, in the memory circuit, the data sample having a magnitude median within the N time ordered data samples by identifying the data sample of the N time ordered data samples having a first metric with a magnitude less than or equal to $(N-1)/2$, and a second metric with a magnitude greater than or equal to $(N-1)/2$.

* * * * *